United States Patent [19]
Gabara

[11] Patent Number: 5,977,796
[45] Date of Patent: Nov. 2, 1999

[54] LOW VOLTAGE DIFFERENTIAL SWING INTERCONNECT BUFFER CIRCUIT

[75] Inventor: Thaddeus John Gabara, Murray Hill, N.J.

[73] Assignee: Lucent Technologies, Inc., Murray Hill, N.J.

[21] Appl. No.: 08/882,827

[22] Filed: Jun. 26, 1997

[51] Int. Cl.⁶ ................... H03K 19/094; H03K 19/0185
[52] U.S. Cl. ................. 326/86; 326/34; 326/30; 326/119
[58] Field of Search ................. 326/21, 30, 83, 326/86, 119, 121, 125, 34

[56] References Cited

U.S. PATENT DOCUMENTS

| | | | |
|---|---|---|---|
| 5,216,297 | 6/1993 | Proebsting | 326/86 |
| 5,408,497 | 4/1995 | Baumann et al. | 327/126 |
| 5,519,728 | 5/1996 | Kuo | 326/86 |
| 5,541,532 | 7/1996 | McCall | 326/83 |
| 5,635,859 | 6/1997 | Yokota et al. | 326/83 |
| 5,798,658 | 8/1998 | Werking | 326/17 |
| 5,818,261 | 10/1998 | Perner | 326/86 |

OTHER PUBLICATIONS

"Draft Standard For Low–Voltage Differential Signal (LVDS) For Scalable Coherent Interface (SCI)", Draft 1.3, Nov. 27, 1995 [Draft 1.3 IEEE P1596.3–1995].

*Primary Examiner*—Jon Santamauro
*Assistant Examiner*—Don Phu Le
*Attorney, Agent, or Firm*—Darby & Darby

[57] ABSTRACT

A low voltage differential swing interconnect I/O buffer within an output buffer part comprising a voltage controlled current source, voltage controlled current sink, and a current switch and an input buffer part comprising a voltage controlled resistance. The output current and input resistance of the I/O buffer is determined by biasing voltages which are generated by on-chip reference circuits and applied to the voltage controlled components of the I/O buffer. Using two input reference voltages and a single reference resistor, the reference circuits dynamically adjust the biasing voltages so that the I/O buffer maintains the required output current and input resistance for all manufacturing process, supply voltage, and chip temperature variations.

55 Claims, 12 Drawing Sheets

5,977,796

LOW VOLTAGE DIFFERENTIAL SWING INTERCONNECT BUFFER CIRCUIT

FIELD OF THE INVENTION

This invention relates to an I/O interface circuit that maintains high speed data transfer between integrated devices on a printed circuit board. More particularly, the invention relates to input and output buffers having a low voltage differential swing interconnect that are biased to the proper operating levels by on-chip reference circuits.

BACKGROUND OF THE INVENTION

In today's computing environment, there is a growing demand for increased processing speed in order for the computer to operate efficiently. For instance, the resources of a modern computer can be saturated when the user specifies a finer mesh or higher resolution for the solution to a physical problem in areas such as hydrodynamics or 3-D graphics.

One way to increase processing speed is to utilize a large number of processors cooperatively. Processor cooperation is provided by the Scalable Coherent Interface ("SCI"), which is a high-speed packet transmission protocol that efficiently provides the functionality of bus-like transactions (read, write, lock, etc.) between processors. However, the initial physical implementations are based on Emitter-Coupled Logic ("ECL") signal levels, which consume more power than is practical in a low cost workstation environment. Additionally, ECL specifications require a 1 Gbyte per second bandwidth (for 16-bit data path), which is too expensive in a workstation environment.

In order to overcome the drawback of costly ECL signal levels, it has been proven to be cost effective to utilize a data path which is of sufficient bandwidth, but is narrower than the wider bandwidth of ECL signal levels. The combination of a high speed transmission environment and efficient protocols provides the link for multiple processors to cooperate in a low-cost workstation. Therefore, the IEEE Computer Society established the Low Voltage Differential Swing ("LVDS") standard, which is a signaling alternative to the ECL signal level protocol. The LVDS interface was standardized by the IEEE in the draft standard for Scalable Coherent Interface (SCI) LVDS, IEEE STANDARD, p. 1596.3, dated Sep. 9, 1993.

Essentially, an LVDS interface is a balanced I/O buffer driver that sends data by current signaling in a balanced interconnect environment. I/O buffer circuits are important in computers for maintaining high speed data transfer between packaged devices on a circuit board or between different backplanes. Typically, LVDS circuits operate in excess of 700 Mb/s in the $0.35\mu$ CMOS technology, wherein a balanced pair of 50 Ω transmission lines are terminated across an on-chip resistance of 100 Ω. The output buffer must provide a signal current of 4 mA and be biased to cause a voltage drop across the on-chip input resistance from 1.4 to 1.0 volts. One drawback with conventional LVDS circuits is that the operating characteristics of the I/O circuits shift with variations in temperature and supply voltage. Further, even if different chips have identical supply voltages and are at the same temperature, the operating characteristics of buffers connected across different chips may vary due to variations introduced in fabrication.

SUMMARY OF THE INVENTION

The object of the present invention is to provide an LVDS I/O buffer that maintains high speed data transfer between package devices on a printed circuit board or between different backplanes. The operating point of the LVDS input and output buffers are biased with voltages generated by reference feedback circuits so that output buffer voltage and current and input buffer impedances remain constant over all processes, voltage and temperature conditions, and therefore, the voltage logic levels for transmitted data are also constant. In accordance with the invention, the reference circuits can generate bias voltages for all input and output buffers on a chip using only a single internal or external reference resistor $R_{EXT}$ and reference voltages $V_{HIGH}$ and $V_{LOW}$.

BRIEF DESCRIPTION OF THE DRAWINGS

The foregoing and other features of the present invention will be readily understood from the following detailed description of the preferred embodiment taken in conjunction with the accompanying drawings wherein.

DETAILED DESCRIPTION OF THE PREFERRED EMBODIMENTS

Figure 1A:
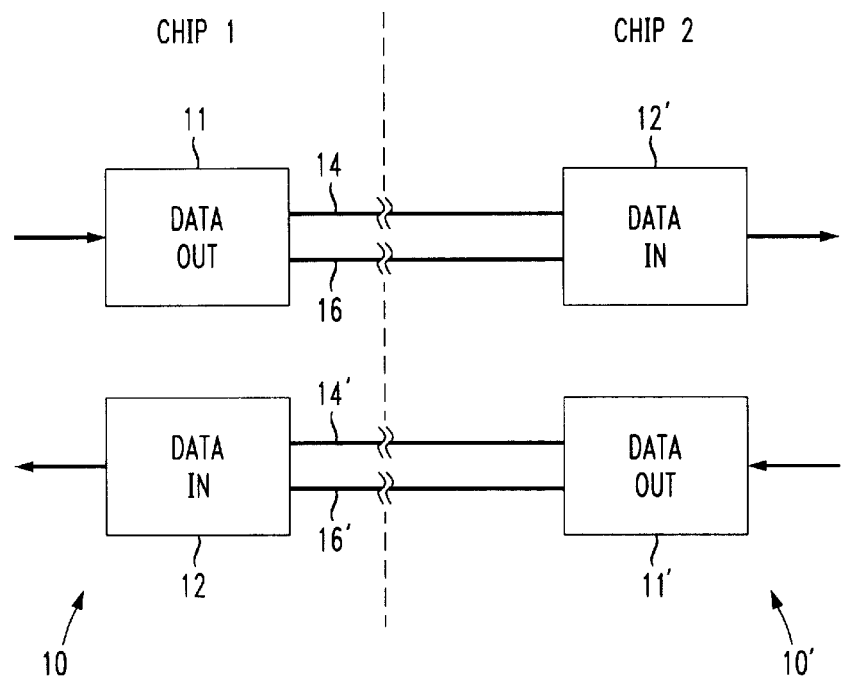
FIG. 1A is a block diagram illustration of two generic I/O buffers located on different chips and connected to each other.

FIG. 1A is an illustration of two generic I/O buffers 10, 10' connected to each other. Each I/O buffer 10, 10' contains output buffer 11, 11' and input buffer 12, 12', respectively. Data is output from the first chip through output buffer 11 and transmission lines 14 and 16, and input to the second chip by input buffer 12'. Analogously, data from the second chip is output by output buffer 11' through transmission lines 14', 16' and input to the first chip by input buffer 12.

Figure 1B:
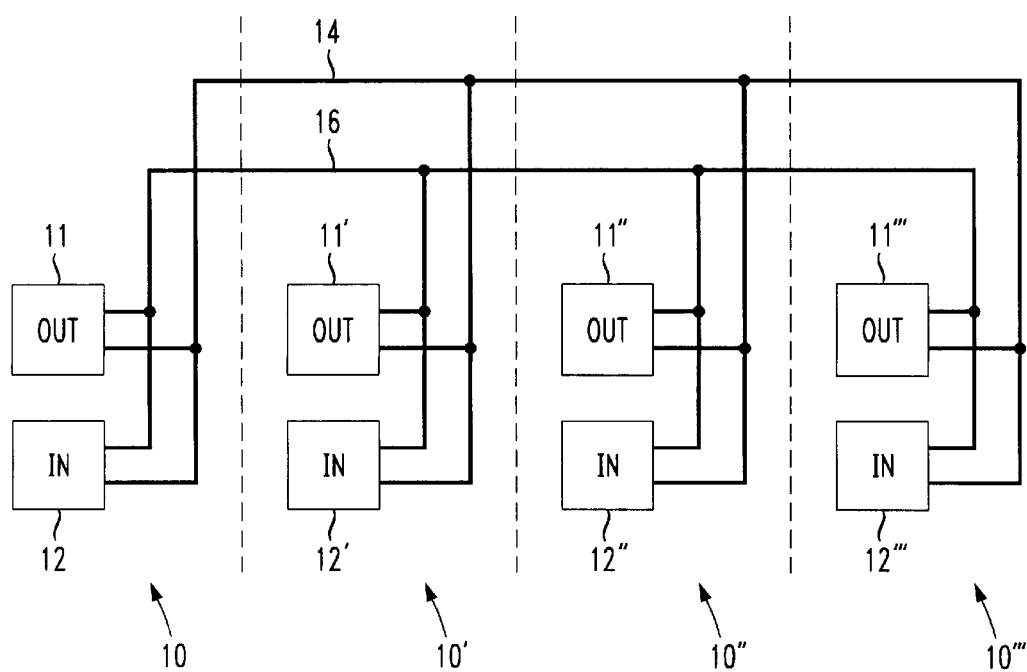
FIG. 1B is a block diagram illustration of four generic I/O buffers connected in a bus configuration.

Alternatively, output buffer 11 and input buffer 12 may be configured to share the same pair of transmission lines 14, 16 as shown in FIG. 1B. In this embodiment, I/O buffer 10 is selectively enabled for an input or output mode. I/O buffers 10', 10'', and 10''' are similarly configured. In this manner, many I/O buffers can communicate with each other over a single shared interface.

Output buffer 11 and input buffer 12 of I/O buffer 10 are constructed on a single integrated circuit chip. Buffers 11', 12' of I/O buffer 10' are likewise on a single chip, which may be separate from the one containing I/O buffer 10. Output buffer 11 and input buffer 12' will be discussed to illustrate the complete input-output circuit created when two I/O buffers, 10, 10' are connected to each other. For purposes of this discussion, I/O buffers 10 and 10' are identical and therefore descriptions of input buffer 12' equally describe input buffer 12.

Figure 2:
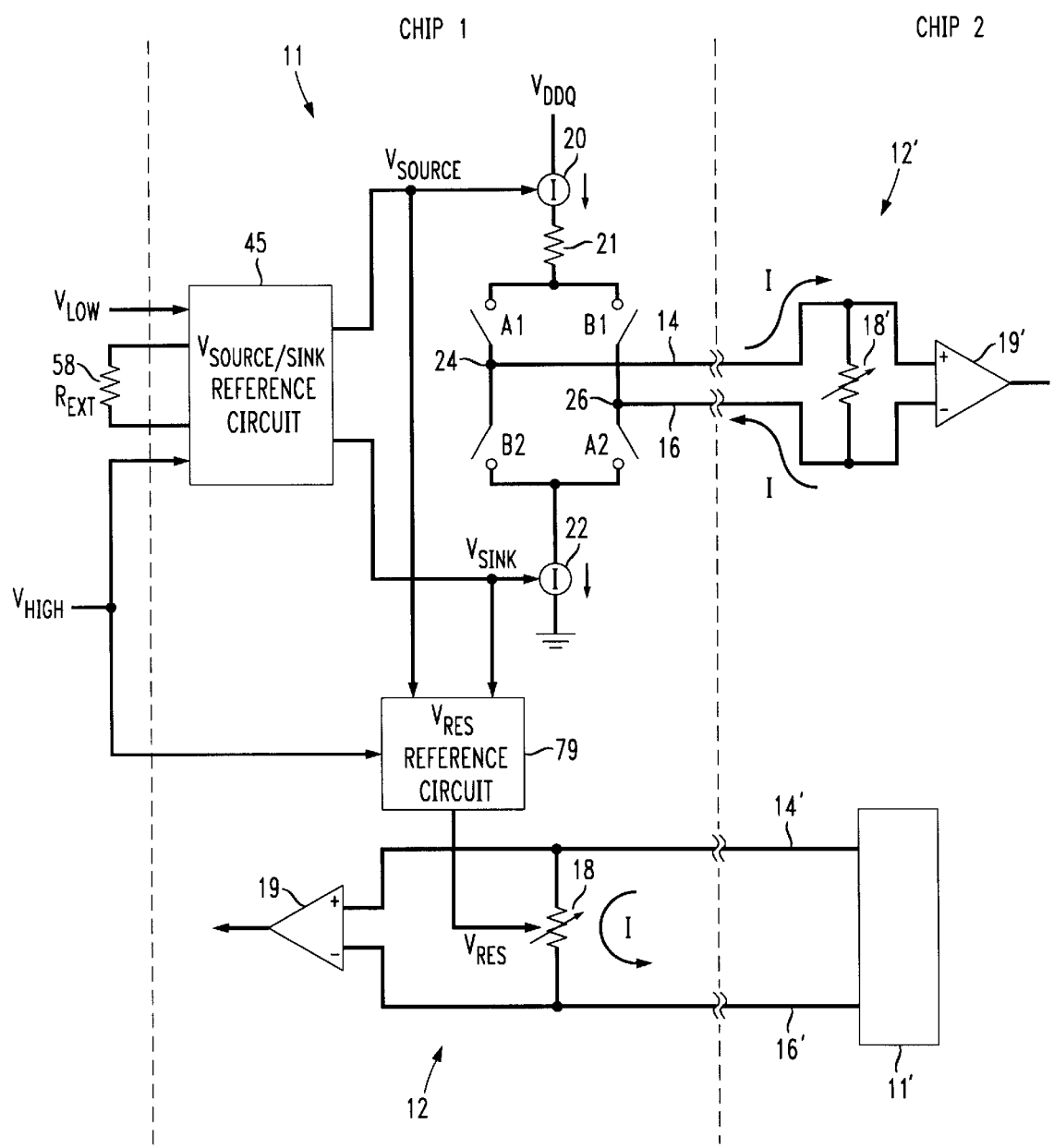
FIG. 2 is an ideal circuit representation of the LVDS I/O buffer of the present invention.

FIG. 2 illustrates an ideal circuit representation of the LVDS output buffer 11 and input buffers 12 and 12' in accordance with an illustrative embodiment of the present invention. Output buffer 11 functions using current steering techniques and can source and sink current simultaneously to and from the interconnect transmission lines 14, 16. A voltage source $V_{DDQ}$ is coupled to a voltage controlled current source 20, which is connected to parallel switches A1 and B1. A voltage controlled current sink 22 is connected between ground and parallel connected switches B2 and A2, which are respectively connected to switches A1 and B1 in series. Switches A1, A2, B1, and B2 are preferably fabricated from n-channel MOS transistors, but are not limited thereto, and may be fabricated in CMOS or other types of devices such as Bipolar Junction Transistors. The Bias voltages $V_{SOURCE}$ and $V_{SINK}$ for voltage controlled current source 20 and voltage controlled current sink 22 are generated by reference circuit 45 and are dependent on reference resistor 58 and reference voltages $V_{HIGH}$ and $V_{LOW}$. Reference resistor 58 should be a high precision device and can be an external component or can be formed on the chip by an accurate fabrication technique such as laser trimming. Voltages $V_{HIGH}$ and $V_{LOW}$ may be generated either externally or internally. If desired, gain-limiting resistor 21 may be placed in the current path from the current source 20. Resistor 21 serves to decrease the circuit's sensitivity to variations in $V_{DDQ}$ and may be formed from an active or passive device.

Input buffer 12' is comprised of a voltage controlled resistor 18' and comparator 19', which detects the voltage across resistor 18'. The first interconnect transmission line 14 is coupled to output buffer 11 at a nodal point 24 between switches A1 and B2, and the second interconnect transmission line 16 is coupled at a nodal point 26 between switches B1 and A2. Transmission lines 14, 16 are connected to input buffer 12' across resistor 18'. To properly terminate transmission lines 14 and 16, resistor 18' should have a resistance equal to approximately twice the impedance of each line. Typical values are transmission line impedances of 50 Ω each and a terminating resistance of 100 Ω. Input buffer 12 similarly comprises a voltage controlled resistor 18. The bias voltage $V_{RES}$, shown for the input resistor 18 of input buffer 12, is generated by reference circuit 79 and is dependent on $V_{SOURCE}$, $V_{SINK}$, and one of the two reference voltages (e.g., $V_{HIGH}$).

In operation, when switches A1 and A2 are closed, switches B1 and B2 are open, and visa-versa. When switches A1 and A2 are closed, the current I flowing through current source 20 and current sink 22 is directed across transmission line 14, through resistor 18' and back across transmission line 16 as indicated by the current arrows in FIG. 2. Current I generates a voltage drop across resistor 18' which drop is detected by comparator 19'. Conversely, when switches B1 and B2 are closed, current I flows through resistor 18' in the opposite direction to that indicated by the arrows in FIG. 2 and thus a voltage "drop" of opposite magnitude is generated across resistor 18'. Because current I changes direction, comparator 19' is presented with a peak-to-peak voltage swing of twice the IR drop developed across resistor 18' when current I is simply turned on and off.

The voltage across resistor 18' should drop from a predetermined $V_{HIGH}$ to $V_{LOW}$. Output buffer 11 must therefore control the voltage across resistor 18' in accordance with the predetermined values for $V_{HIGH}$ and $V_{LOW}$ over all processes, voltage, and temperature conditions affecting a packaged device. A typical requirement is for a $V_{HIGH}$ of 1.4 volts and a $V_{LOW}$ of 1.0 volts giving a voltage drop across resistor 18' of 0.4 volts. For a resistor 18' of 100 Ω, a current of 4 mA must be provided. Under this standard, output buffer 11 must provide a 4 mA current and a voltage drop from a 1.4 volt $V_{HIGH}$ to a 1.0 volt $V_{LOW}$ for a $V_{DDQ}$ which may vary between 3.0 and 3.6 volts, an operating temperature range of from 0 to 125° C. and all expected variations in the manufacturing process. These and other standards for LVDS circuits are detailed in *Draft Standard for Low-Voltage Differential Signals (LVDS) for Scalable Coherent Interface (SCI)*, IEEE Draft 1.3, Nov. 27, 1995, The above analysis assumes that there is no significant IR loss in the transmission lines. Generally, a balanced interchip transmission line interface has a resistive loss on the order of 4 mΩ per foot. A 100 foot connection would thus have a voltage drop of 16 mV when driven by a 4 mA current. Provided that $V_{HIGH}-V_{LOW}$ is not too small, this additional voltage drop may be ignored.

It can be appreciated that the LVDS I/O circuit 10 provides several advantages over conventional single ended transfer techniques. For instance, current steering in the output buffer minimizes the ground bounce generated on the transmitting chip. The differential transfer of signals on transmission lines 14, 16 carries the common mode voltage with it, thereby allowing operations without the need of a reference voltage at the input circuit. Additionally, the power dissipation is reduced since the magnitude of the current in the LVDS 10 is one-quarter of the current in conventional single ended circuits such as Gunning Transceiver Logic (GTL). Finally, the circuit may be driven with lower supply voltages than are applied to the core circuits on the IC, further reducing power dissipation.

Figure 3A:
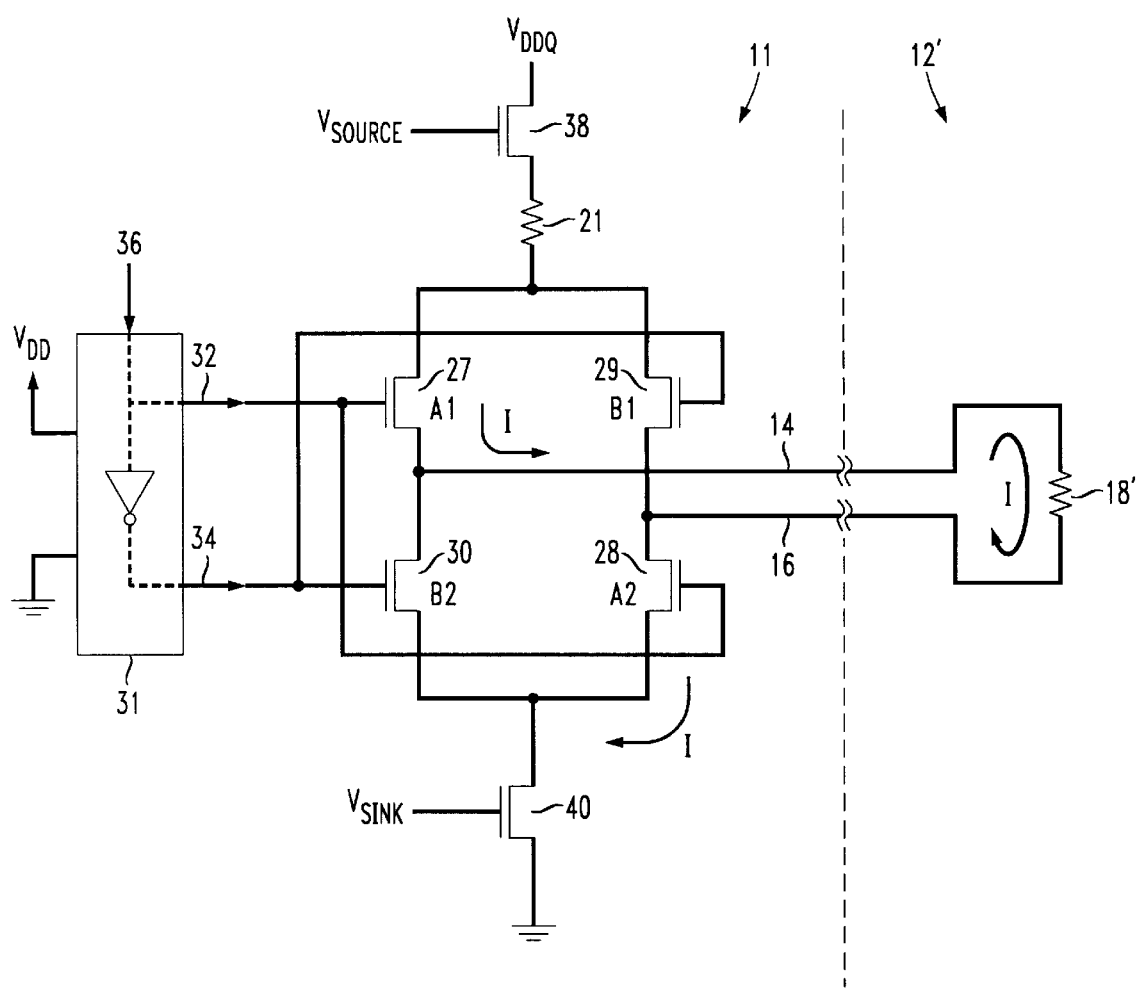
FIG. 3A is a schematic circuit of one embodiment the output buffer portion of the LVDS I/O buffer of FIG. 2.

FIG. 3A illustrates a preferred embodiment of output buffer 11 depicted in FIG. 2 using only n-channel in a CMOS technology. Switches A1, A2, B1, and B2 are formed by transistors 27–30 which have substantially the same geometric dimensions and thus have substantially the same operating characteristics. Current source 20 is formed by transistor 38. The magnitude of current supplied is dependent on gate bias voltage $V_{SOURCE}$. Current sink 22 is formed by transistor 40. The magnitude of current sunk is dependent on gate bias voltage $V_{SINK}$. It should be noted that if the bias voltage $V_{SOURCE}$ applied current source 20 comprising transistor 38 varies over a wide range, transistor 38 may accidentally be biased to behave as a linear device, not a current source. To prevent this, a second transistor smaller than transistor 38 may be placed in parallel with it and biased so it is always enabled. (Not shown.) This arrangement would behave as two parallel current sources or as a resistor in parallel with a current source, depending on the bias voltage applied to transistor 38. Current sink 22 comprised of transistor 40 may also be modified similarly.

Transistors 38 and 40 may alternatively be p-channel devices (see discussion of FIG. 3B, below). Whether a p-channel or n-channel current source or sink should be used is dependent to a large extent on the supply voltages and operating points. Voltages $V_{SOURCE}$ and $V_{SINK}$ are adjusted by the reference circuit 45, shown in FIG. 2, so that the current flow through the transistors results in the proper $V_{HIGH}$ to $V_{LOW}$ voltage drop across resistor 18' when data is being sent. The generation of $V_{SOURCE}$ and $V_{SINK}$ will be discussed with reference to FIGS. 4A and 4B below.

Also depicted in FIG. 3A is an ideal phase splitter 31. A logic high or logic low signal corresponding to the value of the data bit to be output is presented to phase splitter 31 through input 36. The signal is then translated into two signals 32, 34 which are 180° out of phase with respect to each other. Thus, the signal 34 from phase splitter 31 is effectively the inverse logic value of signal 32 as shown in the idealized depiction in FIG. 3A. Note that phase splitter 31 is driven at the chip core voltage $V_{DD}$. Voltage $V_{DD}$ may be greater than or equal to $V_{DDQ}$, depending on the I/O standard the circuit is to comply with an other design parameters. Assuming that a high voltage represents a digital "1", when a "1" is input on line 36, signal 32 should be driven at $V_{DD}$ and signal 34 should be connected to ground. When a "0" is input, signal 32 should be connected to ground and signal 34 should be driven to $V_{DD}$. Signal 32 controls switches A1 and A2 while signal 34 controls switches B1 and B2.

Thus, for example, when a logic "1" is to be sent by output buffer 11, this value is presented to input 36 of phase splitter 31 which drives line 32 to $V_{DD}$ and connects line 34 to ground. The high voltage on line 32 causes switches A1 and A2 to close. The low voltage on line 34 causes switches B1 and B2 to open. This results in a current flow I through switches A1 and A2, transmission lines 14, 16, and resistor 18' in the direction indicated by the arrows. If a logic "0" is sent, line 32 will be connected to ground and line 34 will be driven to $V_{DD}$. Switches B1 and B2 will close and switches A1 and A2 will open, resulting in a current flow across resistor 18' of opposite direction than when a logic "1" is sent.

Figure 3B:
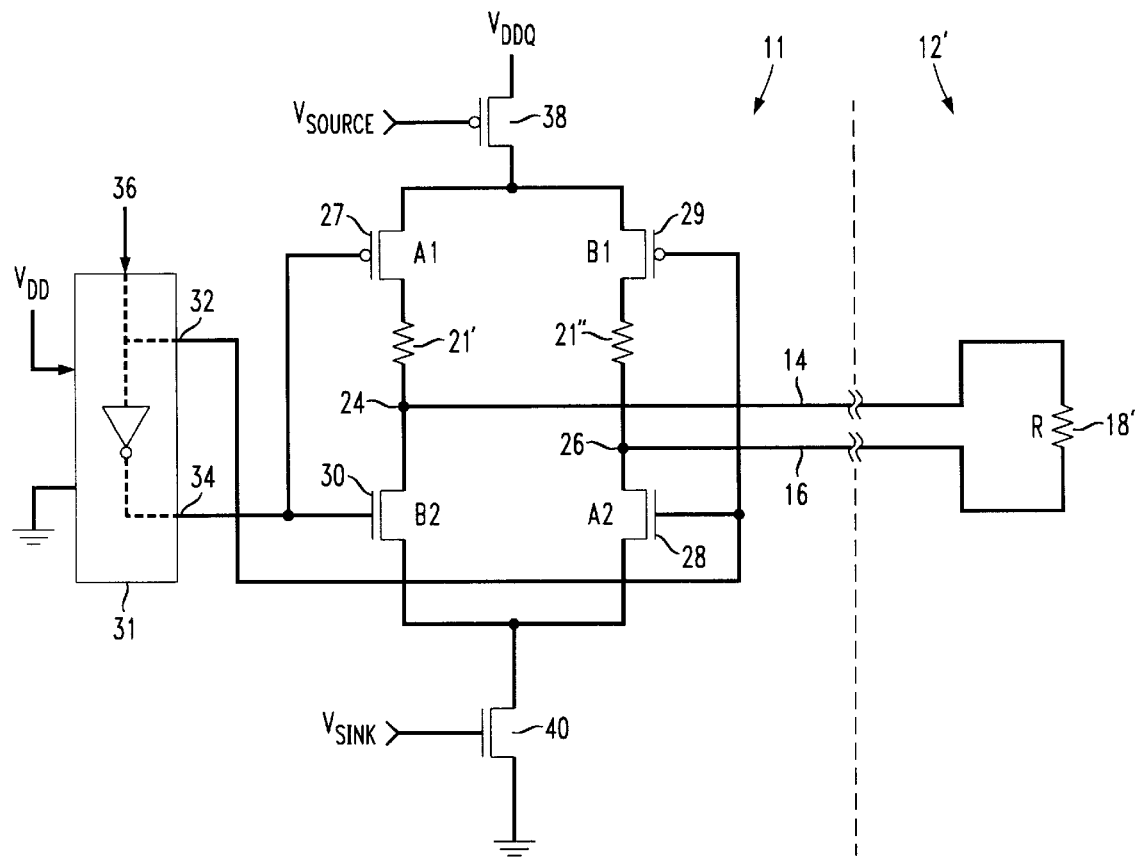
FIG. 3B is a schematic circuit of an alternate embodiment of the output buffer of FIG. 3A.

FIG. 3B illustrates an alternative embodiment of the output buffer 11 in FIG. 2 using CMOS technology. FIG. 3B is similar to FIG. 3A except that switching transistors 27 and 29 (A1, B1) are p-channel instead of n-channel and gain limitary resistor 21 is "split" and is placed after transistors 27 and 29 as resistors 21' and 21", respectively. This circuit functions identically to that of FIG. 3A. Note, however, that in this embodiment switching signal 34 controls switches A1 and B2 and switching signal 32 controls switches B1 and A2. This alternate embodiment also shows a p-channel transistor 38 used to form current source 20. As discussed above, it may be necessary to place a second transistor in parallel with transistor 38 to ensure that current source 20 functions properly for all expected bias voltages.

Figure 3C:
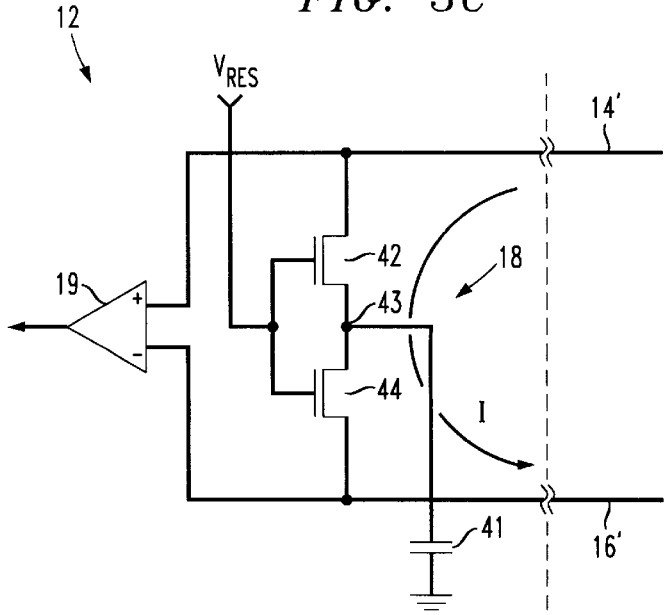
FIG. 3C is a schematic circuit of one embodiment of the input buffer portion of the LVDS I/O buffer of FIG. 2.

FIG. 3C illustrates a preferred embodiment of input buffer 12 depicted in FIG. 2 with on-chip voltage controlled active resistor 18 comprising n-channel MOS transistors 42 and 44 connected in series and biased to gate voltage $V_{RES}$. Transistors 42 and 44 create an active resistor with a resistance inversely dependent on $V_{RES}$. $V_{RES}$ must be set to provide the proper termination resistance based on the characteristic impedances of transmission lines 14' and 16' as discussed above. Typically, transmission lines 14' and 16' have a characteristic impedance of 50 Ω each and thus $V_{RES}$ must be adjusted to cause a total series resistance in transistors 42 and 44 of 100 Ω. The generation of $V_{RES}$ will be discussed with reference to FIG. 5, below. Capacitor 41 is connected between the transistors 42, 44 at node 43 and ground. Capacitor 41 serves to provide an AC ground for common mode signals which may be undesirably induced in interconnects 14' and 16'. It also serves as an AC ground for the intended differential mode signals at 14' and 16'.

Figure 4A:
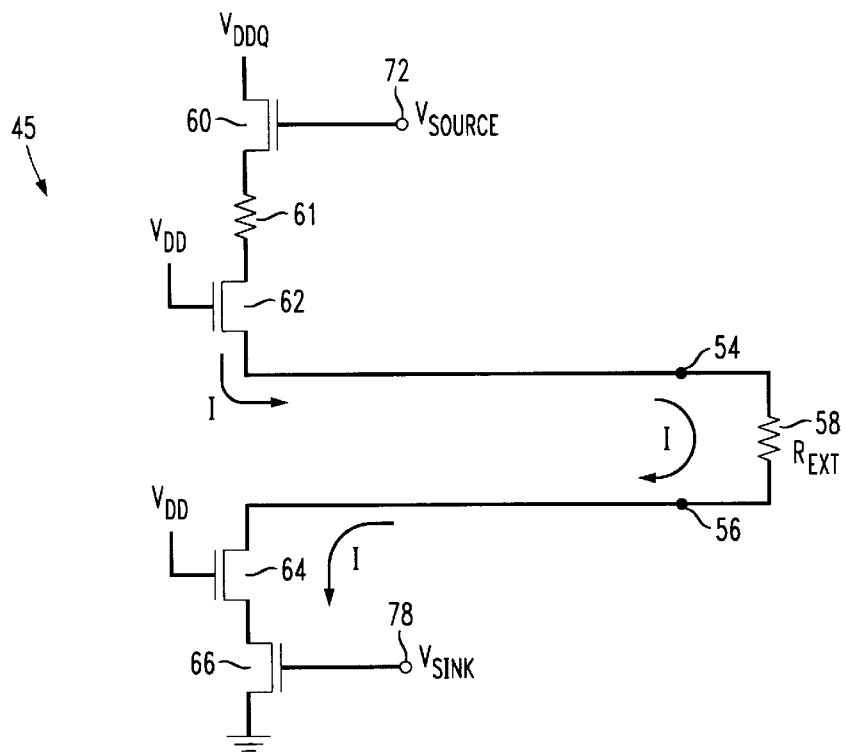
FIG. 4A is a portion of a voltage reference circuit for the LVDS output buffer of FIG. 3A.
Figure 4B:
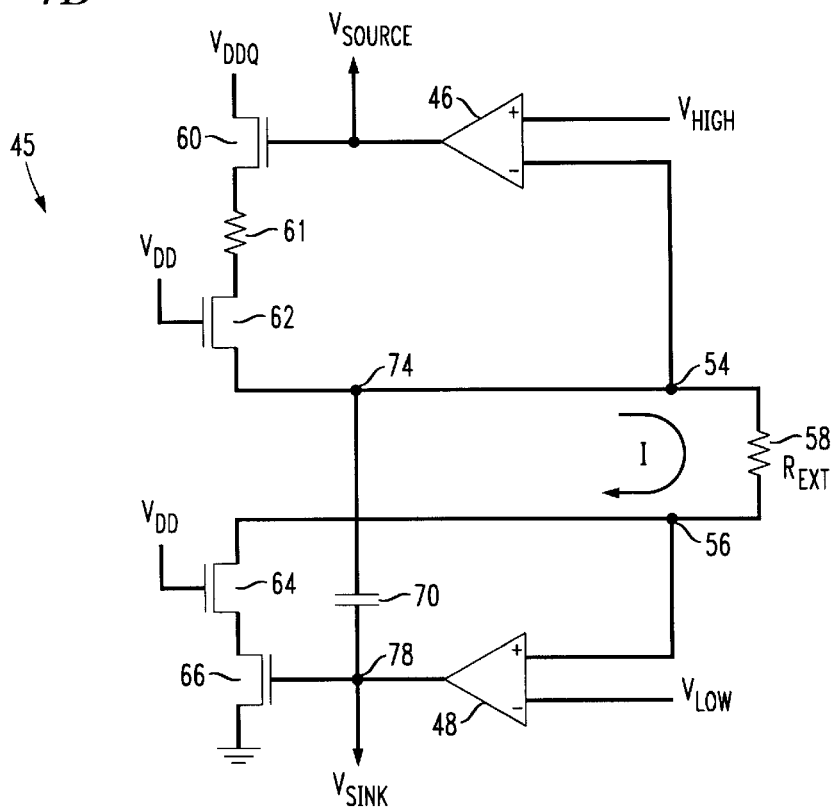
FIG. 4B is a complete voltage reference circuit for the LVDS output buffer of FIG. 3A.
Figure 5:
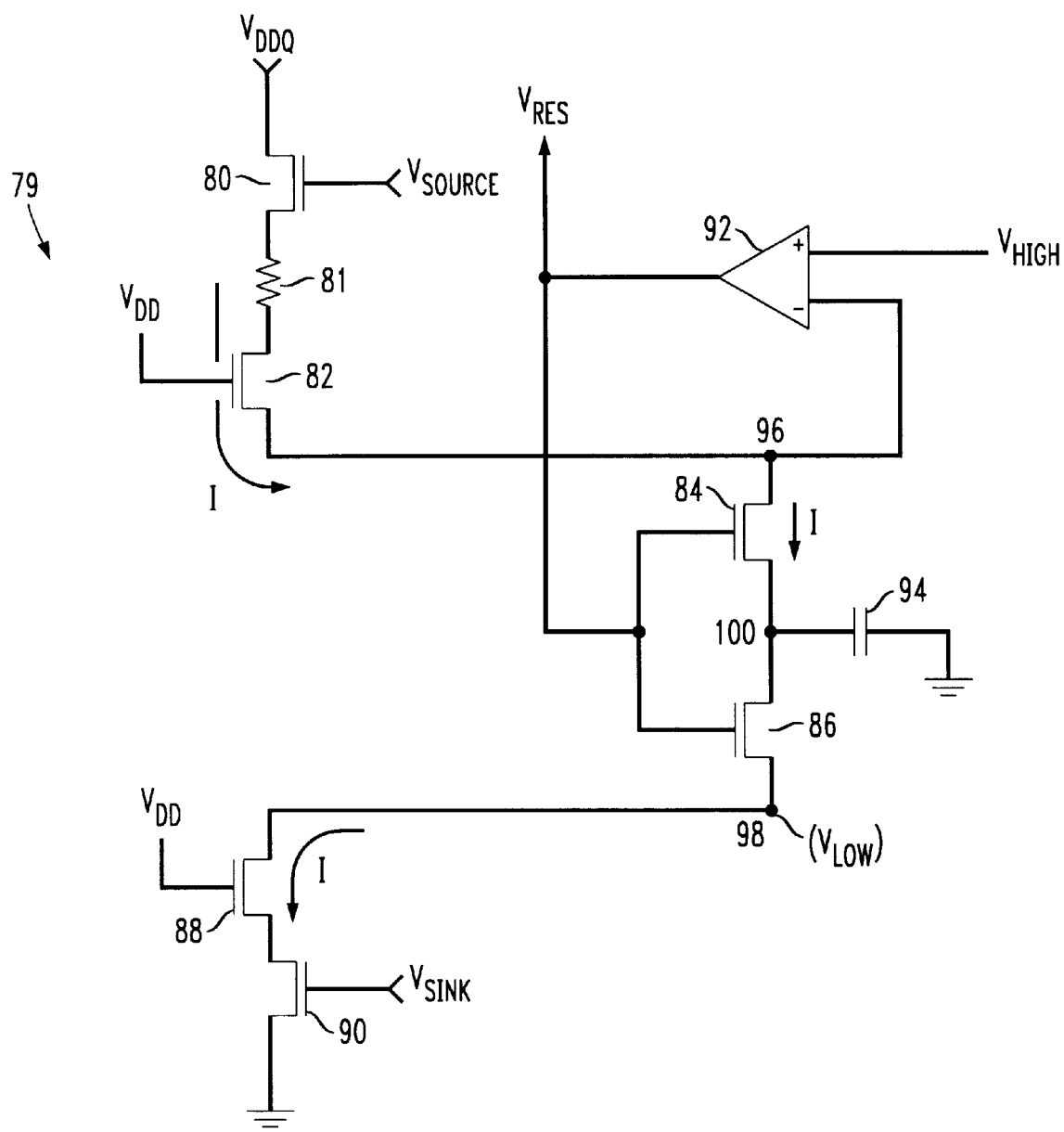
FIG. 5 is a voltage reference circuit for on-chip active resistances.

As discussed with respect to FIGS. 3A through 3C, the operating point of output buffer 11 and input buffer 12 are dependent on the biasing voltages $V_{SOURCE}$, $V_{SINK}$, and $V_{RES}$ generating by reference circuits 45 and 79 depicted in FIGS. 4A, 4B, and 5. A key object of the present invention is to dynamically adjust these voltages over a wide range of operating parameters while still maintaining the proper current flow to insure that the voltage drop across active resistor 18' is from $V_{HIGH}$ to $V_{LOW}$ when a data bit is being sent. The proper biasing voltages are generated by taking advantage of the fact that, in an ideal sense, transistors with the same geometries on the same IC will have essentially identical operating characteristics. All components on a single IC are subjected to the same conditions during fabrication and, ignoring second-order effects, operate at the same temperature and with the same supply voltage. Therefore, regardless of variations in these three parameters, if the operating point for a circuit with given biasing voltages is known, applying those biasing voltages to a corresponding circuit with the same transistor geometries will bias the corresponding circuit to the same operating point.

The reference voltages $V_{SOURCE}$, $V_{SINK}$, and $V_{RES}$ are generated by the two reference circuits 45, 79 (FIG. 2). Through the use of reference voltages $V_{HIGH}$ and $V_{LOW}$ and a reference resistor $R_{EXT}$, the transistor gate bias voltages in the first reference circuit 45 are dynamically adjusted to support a current $I=(V_{HIGH}-V_{LOW})/R_{EXT}$. The feedback-generated bias voltages are then applied to a second reference circuit 79, similar to the first but with the reference resistor replaced by a voltage-controlled active resistance. The components in the second reference circuit have the same operating characteristics as those in the first so the biased transistors will attempt to support the same current $I=(V_{HIGH}-V_{LOW})/R_{EXT}$. Therefore, if the bias voltage for the active resistor is adjusted so that the voltage drop across it is $V_{HIGH}$ to $V_{LOW}$, the active resistance must have a value of $R_{EXT}$. These bias voltages can then be used to insure that all the LVDS I/O buffers 10 on the same chip have an input resistance of $R_{EXT}$ and drive the output transmission lines at a current $I=(V_{HIGH}-V_{LOW})/R_{EXT}$. In this way, LVDS circuit 10 is dynamically adjusted to compensate for variations in temperature and supply voltage.

FIG. 4A is a portion of a schematic representation of the voltage reference circuit 45 which dynamically generated $V_{SOURCE}$ and $V_{SINK}$ for LVDS output buffer 11 depicted in FIG. 3A, but without the feedback circuits. The complete circuit is illustrated in FIG. 4B. With reference to FIG 4A, voltage reference circuit 45 contains n-channel MOS transistors 60 and 62 connected in series from $V_{DDQ}$ to node 54 and n-channel MOS transistors 64 and 66 connected in series from node 56 to ground. Additionally, if a gain-limiting resistor 21 is included in output buffer 11, as shown in FIG. 3A, a corresponding gain-limiting resistor 61 should be included in the current path as indicated. Reference resistor 58 with resistance $R_{EXT}$ is connected between nodes 54 and 56. The reference resistor 58 may be a high-precision external component or may be formed on the chip by e.g., laser trimming techniques. Assuming that all four transistors are biased on, a current will flow from $V_{DDQ}$ through external resistor 58 and into ground as illustrated by current arrow I.

Comparing FIGS. 4A and 3A, it can be seen that the partial circuit of FIG. 4A corresponds to a simplified version of output buffer 11 in FIG. 3A, containing only the conducting path through the current switch. Transistors 62 and 64 in FIG. 4A depict closed switches A1 and A2, or B1 and B2 from FIG. 3A and have the same geometry. The choice is immaterial since the two switch pairs are substantially identical.

Transistor 60 in FIG. 4A corresponds to current source transistor 38 of FIG. 3A. Similarly, transistor 66 corresponds to current sink transistor 40. Therefore, the magnitude of current I, shown in FIG. 4A, is dependent on the gate bias voltages applied to transistor 60 at node 72 and transistor 66 at node 78 in the same way that the current I depicted in FIG. 3A depends on bias voltages $V_{SOURCE}$ and $V_{SINK}$ as discussed above. Reference resistor 58 corresponds to resistor 18' and has resistance $R_{EXT}$ equal to twice the expected characteristic impedance of the output transmission lines 14, 16. (If power conservation is critical, the widths of transistors 60, 62, 64, and 66 can be scaled down a given factor provided that the resistance of $R_{EXT}$ and resistor 61 is increased by the same factor. For example, if the device width was reduced by a factor of 10 and the resistance was increased by a factor of 10, the voltage operating points would remain the same but the circuit would only use 1/10 the power).

The bias voltages at nodes 72 and 78, $V_{SOURCE}$ and $V_{SINK}$ respectively, are independently adjusted so that the current I creates a voltage drop across external resistor 58 from $V_{HIGH}$ to $V_{LOW}$. Because the reference circuit components are chosen so that the circuit has the same operating characteristics as output buffer 11, when corresponding current source and sink transistors 38, 40 (FIG. 3A) are biased to these adjusted voltages, they will attempt to drive the same magnitude current flow I. If resistor 18' has resistance equal to $R_{EXT}$, this current will cause the required $V_{HIGH}$ to $V_{LOW}$ voltage drop across it.

FIG. 4B is the circuit of FIG. 4A showing feedback comparators 46, 48 which set the proper $V_{SOURCE}$ and $V_{SINK}$ voltages. This circuit is essentially two voltage-to-current converters connected in a balanced configuration across an external reference resistance. Reference voltage $V_{HIGH}$ is applied to the non-inverting input of comparator 46. The voltage on reference resistor 58 at node 54 is applied to the inverting input of comparator 46. If the voltage at node 54 is greater than $V_{HIGH}$, the comparator output voltage $V_{SOURCE}$ at node 72 will decrease, causing the current through transistor 60 to drop, thus lowering the voltage at node 54 until it equals $V_{HIGH}$. If the voltage at node 54 is lower than $V_{HIGH}$, the comparator output voltage increases, increasing the current and thus the voltage at node 54. In the steady state, the voltage at node 54 equals $V_{HIGH}$. Analogously, $V_{LOW}$ is applied to the inverting input of comparator 48 and the voltage on external resistor 58 at node 56 is applied to the non-inverting input. Comparator 48 output at node 78, $V_{SINK}$, increases or decreases to adjust the current until node voltage 56 equals $V_{LOW}$. Current I will therefore be set at I=($V_{HIGH}$–$V_{LOW}$)/$R_{EXT}$. For typical values for $V_{HIGH}$=1.4 volts, $V_{LOW}$=1.0 volt and R=100 Ω, current I is 4 mA. Voltages $V_{SOURCE}$ and $V_{SINK}$ are unity gained buffered and applied to all output buffers 11 which are present on the IC, biasing them to the proper operating point.

Capacitor 70 is connected between node 78 ($V_{SINK}$) and node 74. Capacitor 70 provides stability in the reference circuit by acting as a surplus current source or sink to compensate for current and voltage variations caused by noise. For example, if I increases to I+ΔI, where ΔI is noise or another disturbance, the voltages at nodes 54 and 56 would increase and decrease respectively. The feedback loop would cause the voltage at node 78 to decrease with the voltage on node 56. However, since the node 54 (and thus node 74) voltage is increasing, capacitor 70 feeds back this increase to cancel the initial decrease. Thus, this capacitor stabilizes the circuit.

Figure 4C:
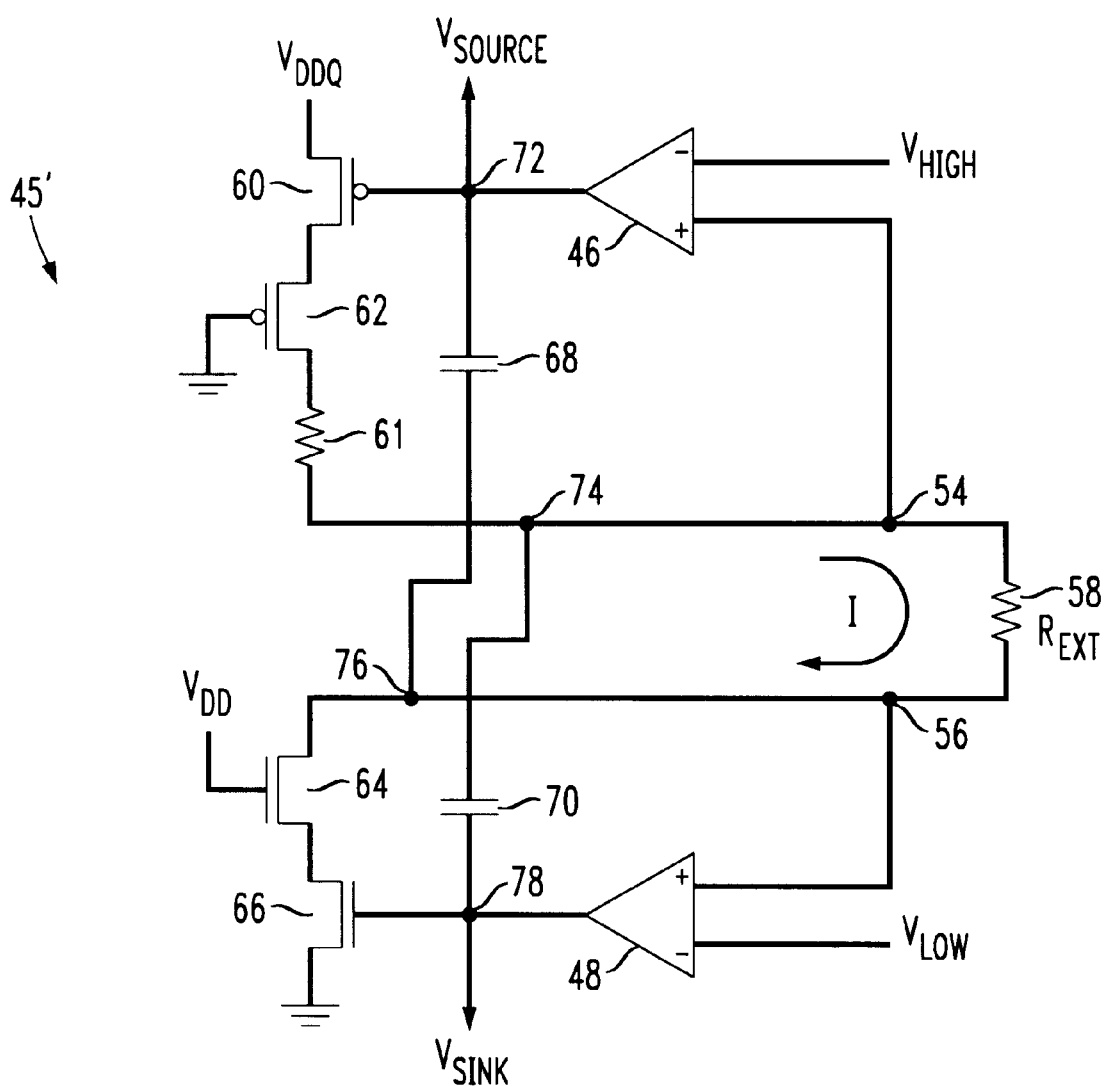
FIG. 4C is a voltage reference circuit for the alternate embodiment of the output buffer shown in FIG. 3B.

The reference circuit 45' for the alternate embodiment of FIG. 3B is shown in FIG. 4C. Transistor 62 is a p-channel device and is biased to ground. An additional stabilizing capacitor 68 has been added between node 72 ($V_{SOURCE}$) and node 76. Capacitor 68 functions analogously to capacitor 70. In this embodiment, resistor 61 corresponds to gain limiting resistor 21' shown in FIG. 3b. Further, current source 60 is also a p-channel device and thus, the inverting and non-inverting inputs to comparator 46 must be reversed. Note that as long as there is equivalency between the devices of the reference circuits and the I/O buffer, any combination of n-channel and p-channel devices may be used, provided that the biasing and comparator polarity is adjusted accordingly.

FIG. 5 is a schematic representation of the voltage reference circuit 79 which dynamically generates $V_{RES}$ for LVDS input buffer 11. As shown in FIG. 3C, $V_{RES}$ sets the resistance across the active resistor 18 comprised of transistors 42, 44. $V_{RES}$ must therefore be adjusted so that the active resistance is twice the expected impedance of input transmission lines 14' and 16'. Equivalently, $V_{RES}$ must set the active resistance to be equivalent to $R_{EXT}$. This is accomplished through the use of a reference circuit with the current source, current sink, and conducting switch elements configured as in the first reference circuit (i.e., like output buffer 11), but replacing $R_{EXT}$ with an active resistance $R_{ACTIVE}$.

Transistors 80, 82 and resistor 81 are connected in series between $V_{DDQ}$ and node 96, and series transistors 88, 90 are connected between node 98 and ground. If a gain-limiting resistor 21 is included in output buffer 11, a corresponding gain-limiting resistor 81 should be included in the current path as indicated. Transistors 80, 82, 88, 90 and biased to gate voltages $V_{SOURCE}$, $V_{DD}$, $V_{DDQ}$ and $V_{SINK}$ respectively (similar to FIG. 4B). These reference circuit transistors all have the same geometries as their corresponding elements in output buffer 11 depicted in FIG. 3A. If the alternative embodiment of FIG. 3B is used, transistors 80 and 82 in FIG. 5 should be p-channel devices and transistor 82 should be biased to ground, similar to the equivalent circuit section in FIG. 4C. The active resistance is comprised of transistors 84, 86 and is connected between nodes 96 and 98. Transistors 84 and 86 have the same geometries as corresponding transistors 42, 44 which form the active input resistor 18, illustrated in FIG. 3C. It should be noted that the active resistors may be formed using n-channel or p-channel devices, depending on the actual values of cottages $V_{HIGH}$ and $V_{LOW}$.

Current I will flow from $V_{DDQ}$ to ground and generate a voltage drop across the active resistor V=I*$R_{ACTIVE}$. Because of the equivalence between the circuit components discussed above, when $V_{SOURCE}$ and $V_{SINK}$ are applied to transistors 80 and 90 respectively, the transistors will try to support a current equal to the same steady-state current I=($V_{HIGH}$–$V_{LOW}$)/$R_{EXT}$ that exists in reference circuit 45 of FIG. 4B. The voltage at node 96 is compared with $V_{HIGH}$ by comparator 92, whose output $V_{RES}$ controls the active resistance. The feedback loop will dynamically adjust the resistance until the voltage at node 96 equals $V_{HIGH}$. Because of the equivalence between these circuit components and those in reference circuit 45, discussed above, when the voltage at node 96 equals $V_{HIGH}$, current I from $V_{DDQ}$ to node 96 is the same as in reference circuit 45, i.e., $(V_{HIGH}-V_{LOW})/R_{EXT}$, and the voltage at node 98 is $V_{LOW}$. Therefore, the active resistance $R_{ACTIVE}$ set by $V_{RES}$ must be $(V_{HIGH}-V_{LOW})/I = R_{EXT}$. The control voltage $V_{RES}$ is buffered and used to set the resistance of all input buffer active resistors 18 (FIG. 3C) equal to $R_{EXT}$. Capacitor 94 is connected between node 100 and ground and may be formed by an n-channel transistor with the gate connected to node 100 and both the source and drain connected to ground. Capacitor 94 has the same layout dimensions as capacitor 41 in FIG. 3C and is duplicated in the circuit of FIG. 5 to insure that local topographical conditions are identical in all cases when this resistor is used.

For the typical values of $V_{HIGH}=1.4$ volts, $V_{LOW}=1.0$ volts and $R_{EXT}=100 \Omega$, when transistors 80 and 90 are biased at $V_{SOURCE}$ and $V_{SINK}$, they will attempt to support a current flow of 4 mA. Comparator 92 will adjust voltage $V_{RES}$ until the voltage at node 96 equals a $V_{HIGH}$ of 1.4 volts. The voltage at node 98 will automatically be set to $V_{LOW}$ of 1.0 volts because of the equivalence with the circuit elements used to generate the applied current source and sink biasing voltages $V_{SOURCE}$ and $V_{SINK}$. Therefore, the active resistance will have a voltage drop of 1.4 to 1.0 volts with a current of 4 mA and thus $V_{RES}$ will set $R_{ACTIVE}$ to 100 $\Omega$. Applying $V_{RES}$ to transistors 42 and 44 comprising input resistor 18 (FIG. 3C) will therefore create the desired input resistance of 100 $\Omega$.

Figure 6:
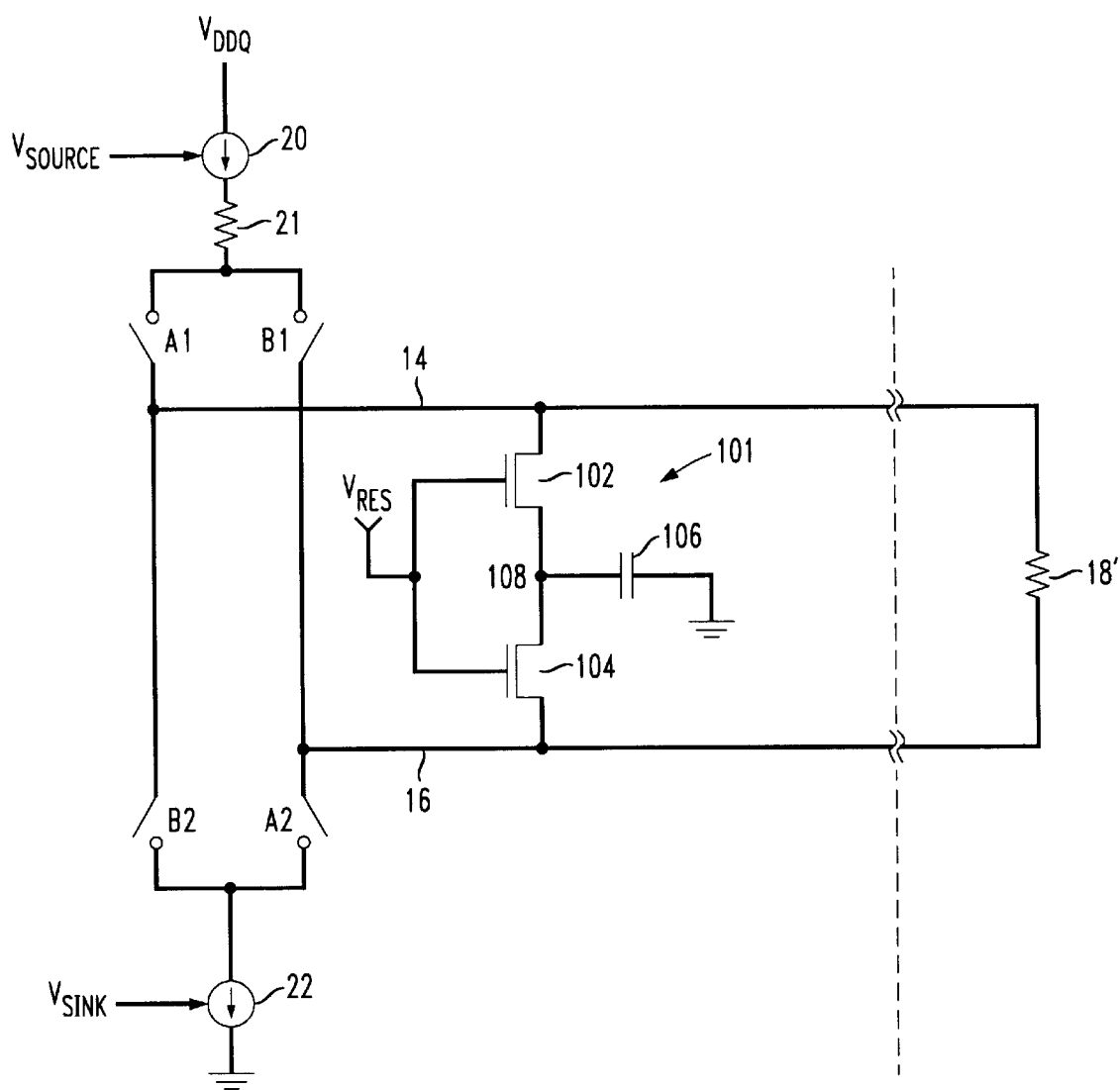
FIG. 6 is a schematic circuit of the output buffer portion of the LVDS I/O of FIG. 2 further including an on-chip resistance between output terminals.

FIG. 6 is a schematic diagram of output buffer 11, shown in FIG. 2, further including an active on-chip resistance 101 connected across transmission lines 14 and 16 and in parallel with resistor 18'. Active resistor 101 is comprised of series transistors 102 and 104 with capacitor 106 connected between them at node 108 to ground. Transistors 102 and 104 have substantially the same geometries as the active resistances discussed above. Therefore, when the gates of transistors 102 and 104 are biased to $V_{RES}$, active resistor 101 will have a resistance equal to $R_{EXT}$. This additional resistance will absorb signals which are induced in the transmission lines 14, 16 and flow back to the output buffer 11 and will also improve the matching characteristics of the output buffer 11 to the transmission lines 14, 16 by ensuring that the output buffer 11 and transmission lines 14, 16 are properly balanced. In this embodiment, both ends of the balanced transmission lines 14, 16 are terminated by a resistance and therefore the output buffer 11 must provide double the current to maintain the proper $V_{HIGH}$ to $V_{LOW}$ drop across resistor 18'. This may be accomplished by doubling the width of the current source and switch transistors in the driving circuit (i.e., switch transistors 27–30 and current source/sink transistors 38, 40). Alternatively, this may be done by duplicating output buffer to provide two identical circuits operating parallel to each other, each supplying one-half of the required current. Capacitor 106 functions as an AC ground and may be formed by an n-channel transistor with the gate connected to node 108 and both the source and drain connected to ground.

Figure 7:
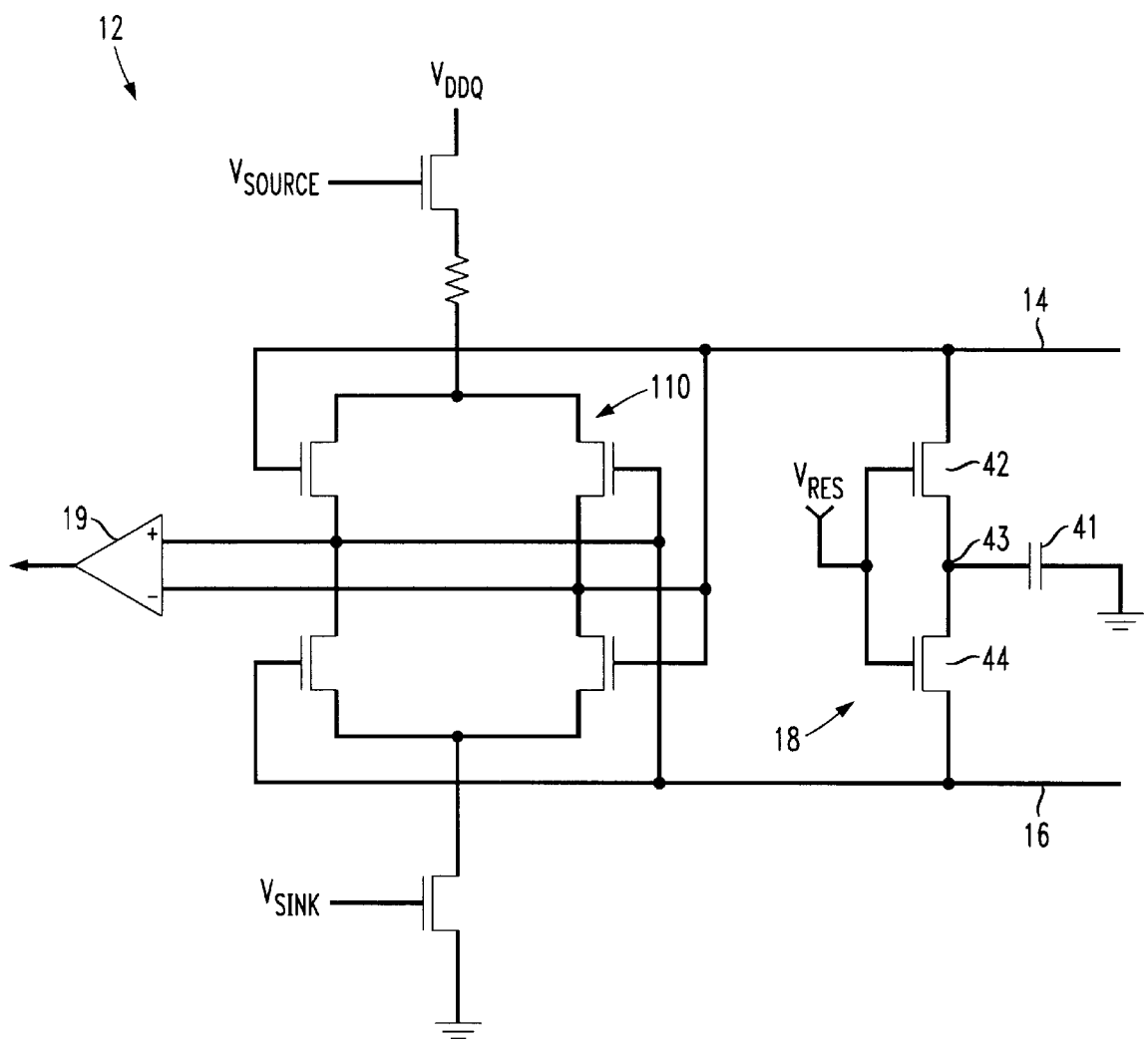
FIG. 7 is a schematic circuit of the input buffer portion of the LVDS I/O of FIG. 3C further including an internal RAM cell.

FIG. 7 is a schematic diagram of input buffer 12, shown in FIG. 3C, further including an internal 1-bit RAM cell 110 located between active resistance 18 and comparator 19. The RAM cell 110 of the input buffer 12 provides hysteresis which prevents the output of comparator 19 from oscillating when input lines 14' and 16' are not being actively driven. RAM cell 110 is formed using the same circuit configuration as in output buffer 11 of FIG. 3A to insure that this memory cell limits the voltage swing to the same voltage levels being generating by the output buffer. An equivalent circuit with p-channel devices can also be made similar to the p-channel embodiments discussed above. The sizes of the components in RAM cell 110 may be scaled down from corresponding device sizes in output buffer 11 because it does not need to supply current to drive the output transmission lines 14', 16'.

Figure 8:
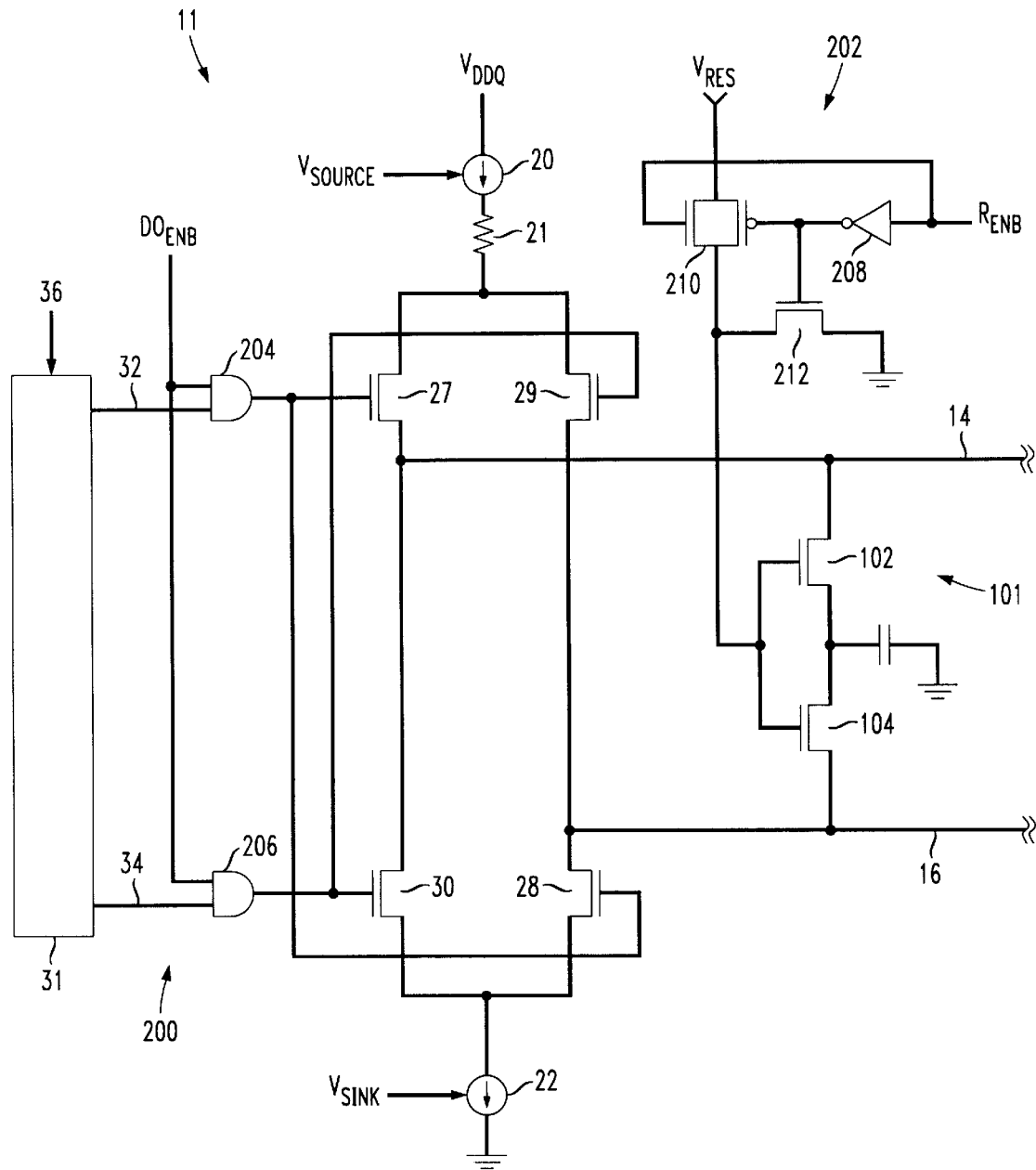
FIG. 8 is a circuit representation of the input and output buffers shown in FIGS. 3A and 3C further including output buffer and output resistance enabling means.
Figure 9:
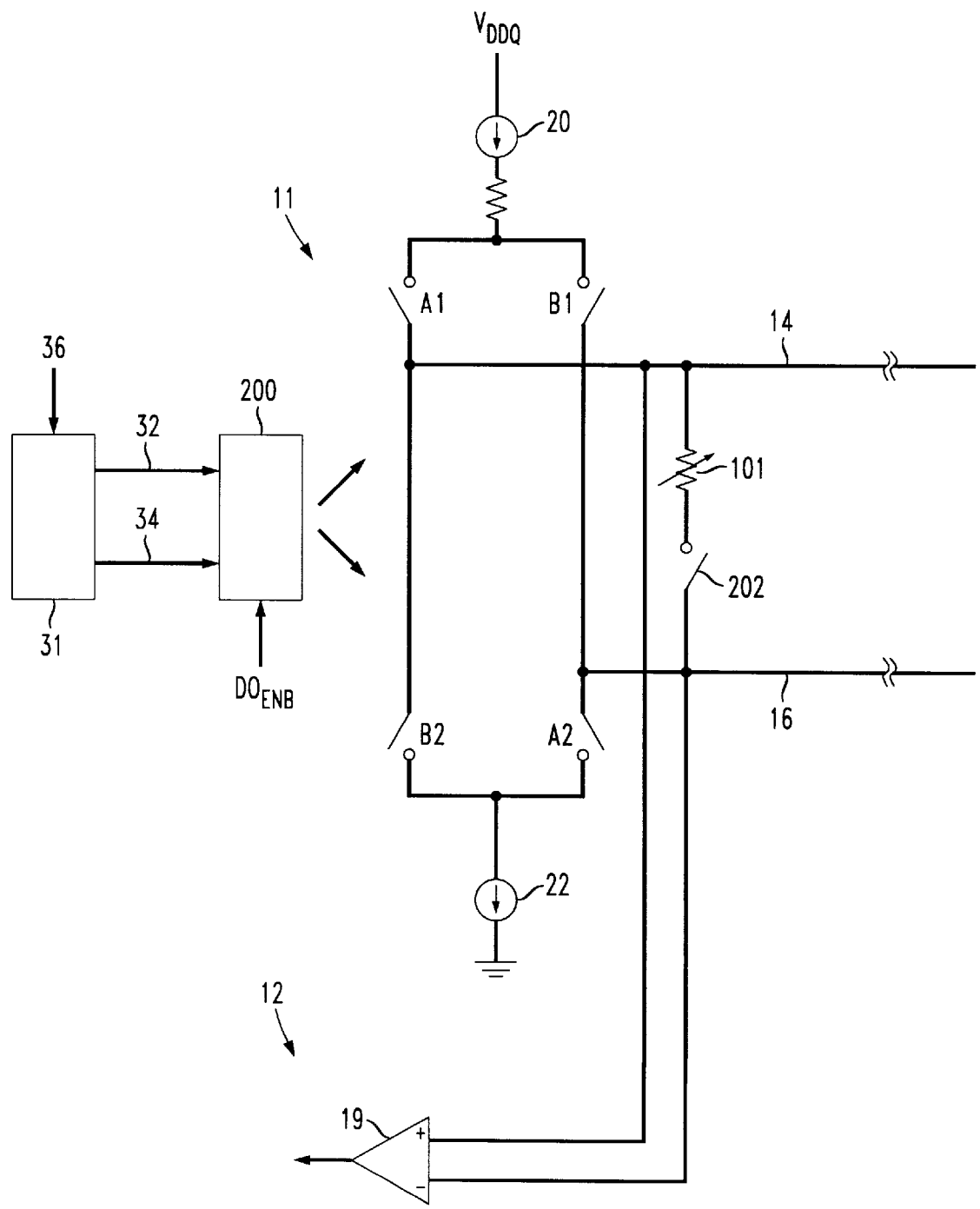
FIG. 9 is a circuit diagram of an input buffer and output buffer connected in parallel to a single data bus.

An alternative embodiment of I/O buffer 10 is illustrated in FIGS. 8 and 9. This embodiment allows multiple I/O buffers to share a single pair of connecting wires by including enabling and disabling means to allow the circuit to be "tri-statable." FIG. 8 shows the output buffer 11 further including data out enable circuit 200 and active on-chip output resistance 101 further including resistance enable circuit 202.

Data output enable circuit 200 is controlled by data out enable signal $DO_{ENB}$ and is comprised of gates 204 and 206 which pass signals 32 and 34 when enabled by $DO_{ENB}$ and bias switches 27–29 in a non-conducting state when disabled. These gates may be AND gates as shown in FIG. 8A or any other circuit which performs the enabling function. Also, depending on the enabling circuitry employed, $DO_{ENB}$ may be active high or active low. Further, if inverting gates are used, the polarity of the phase splitter 31 may have to be reversed by, e.g., switching the connection of signal 32 with signal 34. Four gates can be used, one for each switch to ensure that the edges can be adjusted independently of one another for high speed operation. (Not shown.)

Resistance enable circuit 202 is a switching circuit controlled by resistance enable signal $R_{ENB}$ that biases transistors 102, 104 of active resistance 101 to either $V_{RES}$ or ground. In one embodiment, resistance enable circuit 200 is comprised of inverter 208 which drives transmission gate 210 and transistor 212. When $R_{ENB}$ is active, transmission gate 210 is in the conducting state, transistor 212 is non-conducting, and $V_{RES}$ is applied to active resistance 101. When $R_{ENB}$ is not active, transmission gate 210 is non-conducting and transistor 212 is on, thus biasing transistors 102 and 104 at ground and placing them in non-conducting states, so they produce a higher resistance instead of about 100 $\Omega$.

FIG. 9 is a circuit diagram of the output buffer 11 shown in FIG. 8 and the input buffer 12 connected to the same transmission line pair 14, 16 as generically indicated in FIG. 1B. In this configuration, resistor 101 controlled by switch circuit 202 may function as either an output resistor as indicated in FIG. 6 or as an input resistance as indicated in FIGS. 2 and 3C. The connections between data out enable circuit 200 to switches A1, A2, B1, and B2 and the biasing voltages are not shown for clarity. It can be appreciated that input comparator 19 will detect the voltage generated across transmission lines 14 and 16. If I/O buffer 10 is transmitting data, switches A1, A2, B1, and B2 will be enabled. If the buffer is only receiving data, the switches can be disabled. Resistor 101 should be enabled if it is necessary to provide a terminating resistance for transmission lines 14 and 16.

Figure 10:
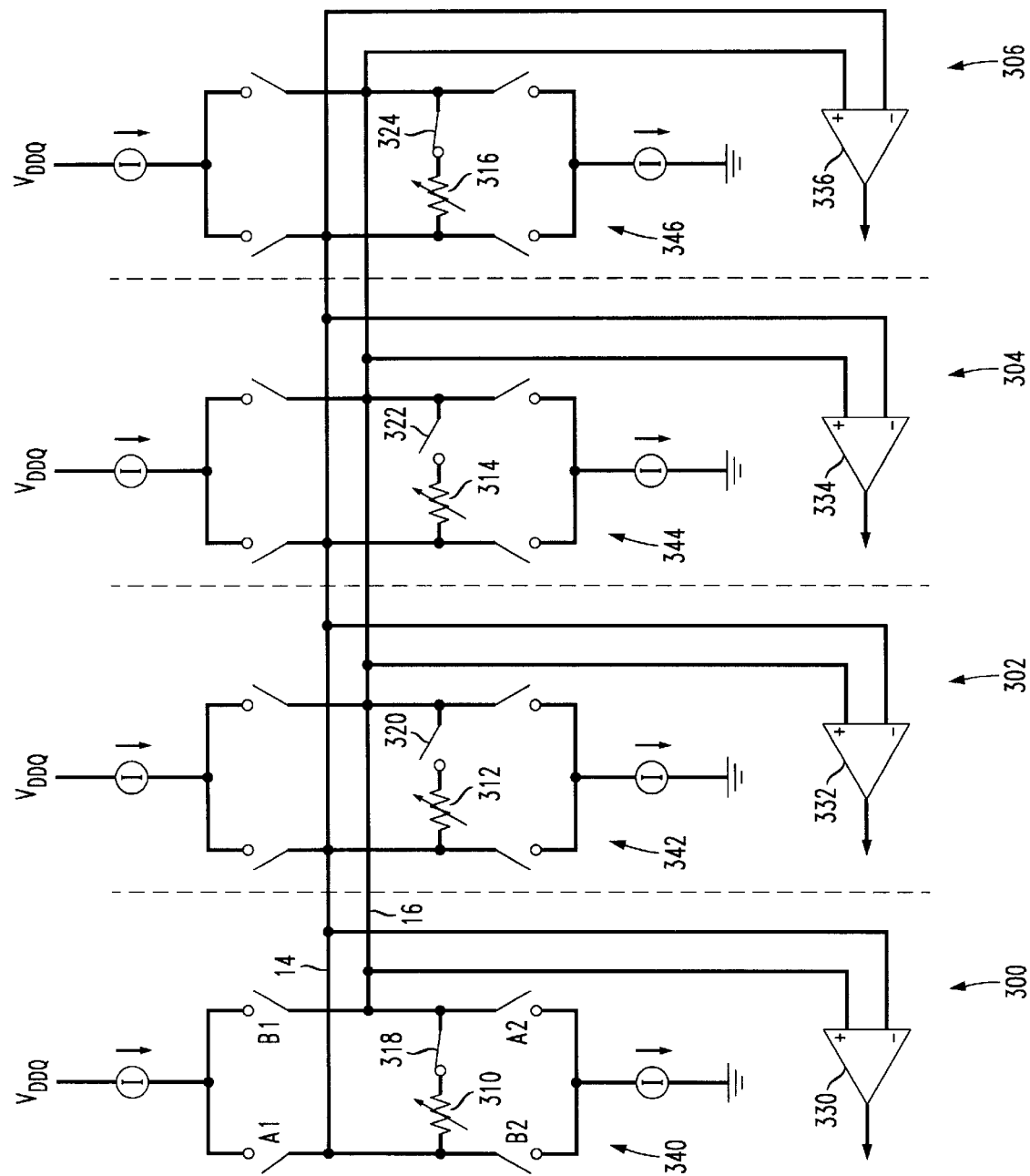
FIG. 10 is a circuit diagram of four I/O buffers as in FIG. 9 connected to a common bus as shown in FIG. 1B.

FIG. 10 shows four I/O buffers 300, 302, 304, and 306 as in FIG. 9 with input buffers 330, 332, 334, and 336 and output buffers 340, 342, 344, and 346 respectively. I/O buffers 300–306 are arranged in a bus configuration as shown in FIG. 1B. The buffers are connected by a single pair of transmission lines 14, 16 and each has a voltage controlled resistor 310, 312, 314, 316 and enabling switch 318, 320, 322, and 324 respectively as discussed with respect to FIGS. 8 and 9, above. Data that is transmitted on transmission lines 14 and 16 is detected by all the input buffers 330, 334, 336, and 338. Each buffer may be located on a separate IC and the arrangement is not limited to four I/O buffers.

I/O buffers 300 and 306 are connected to transmission lines 14 and 16 at the terminating points. To provide a proper terminating resistance, resistors 310 and 316 in I/O buffers 300, 306 are connected across transmission lines 14 and 16 by enabling switches 318 and 324 as shown. Resistors 312 and 314 in buffers 302 and 304 are disabled so that current is not unnecessarily drawn from transmission lines 14, 16.

The output buffers 340, 342, 344, and 345 are enabled or disabled depending on whether they are transmitting or receiving data. For example, assume that output buffer 340 in buffer 300 is enabled and is driving a data signal onto the bus. Half of the current will flow through resistor 310 and the other half will flow through resistor 316. Resistors 312 and 314 as well as output buffers 342, 344, and 346 are all in the disabled state so that they do not draw any current. Thus, the voltage drop across resistors 310 and 316 will be the proper $V_{HIGH}$ to $V_{LOW}$ voltage drop in accordance with the biasing voltages $V_{SOURCE}$, $V_{SINK}$, and $V_{RES}$, set by the reference circuits based on reference voltages $V_{HIGH}$ and $V_{LOW}$, and external reference resistor $R_{EXT}$ as discussed above. This voltage drop is detected by input buffers 330, 332, 334, and 336. When data is sent by buffer 302, output buffer 342 is enabled and output buffers 340, 344 and 346 are disabled. Half of the source current flows to the right and through resistor 316 and the other half goes to the left through resistor 310. Note that the enabled/disabled configuration for resistors 310, 312, 314, and 316 does not have to be changed. The configuration can be set during startup.

While the invention has been particularly shown and described with reference to preferred embodiments thereof, it will be understood by those skilled in the art that various changes in form and details may be made therein without departing from the spirit and scope of the invention.

I claim:

1. An integrated circuit that includes a low voltage differential swing interconnect buffer and biasing circuit for data transmission over first and second balanced transmission lines having a terminating resistor of a first resistance; said integrated circuit connected to a reference resistance;

said interconnect buffer and basing circuit comprising:

an output buffer connected to said transmission lines and comprising a first voltage controlled current source having a first bias voltage and being connected to a first supply voltage, a first voltage controlled current sink having a second bias voltage and being connected to ground, and a current switch being connected in series between said first voltage controlled current source and said first voltage controlled current sink, said current switch controlling the direction of current flow from said output buffer and through said first and second balanced transmission lines and terminating resistor;

an input buffer comprising a first voltage controlled input resistor having a third bias voltage and a comparator for detecting the polarity of a voltage drop across said voltage controlled input resistor when input current flows through it;

a first voltage reference circuit having high and low input reference voltages and being connected to said reference resistance, said first voltage reference circuit generating said first and second bias voltages such that current from said output buffer through said first and second transmission lines generates a voltage drop across said terminating resistor substantially from said high input reference voltage to said low input reference voltage; and a second voltage reference circuit having as an input said first and second bias voltages and at least one of said input reference voltages, said second voltage reference circuit generating said third bias voltage to bias said first voltage controlled resistor in said input buffer to a resistance substantially equal to said first resistance.

2. The circuit of claim 1, wherein said current switch comprises a first and second switch connected to a first node, and a third and fourth switch connected to a second node;

said first and third switches being connected in series and said second and fourth switches being connected in series;

said first transmission line being connected to said first and third switches, and said second transmission line being connected to said second and fourth switches;

a first current path being defined by when said first and fourth switches are conducting and said second and third switches are non-conducting; and a second current path being defined when said first and fourth switches are non-conducting and said second and third switches are conducting.

3. The circuit of claim 2, further including a current switch control circuit having a binary data input signal and a plurality of output control signals which bias said first through fourth switches as either conducting or non-conducting to thereby select either said first current path or said second current path according to the value of said data input signal.

4. The circuit of claim 3, wherein said current switch control circuit is connected to a second supply voltage, said second supply voltage having magnitude greater than or equal to said first supply voltage.

5. The circuit of claim 2, wherein said first voltage reference circuit comprises:

a second voltage controlled current connected to said first supply voltage and a fifth switch biased in the conducting state and connected in series between said second voltage controlled current source and said reference resistor at a third node;

a second voltage controlled current sink connected to ground and a sixth switch biased in the conducting state and being connected in series between said second voltage controlled current sink and said reference resistor at a fourth node; and a feedback circuit generating said first and second bias voltages which bias said second voltage controlled current source and said second voltage controlled current sink, respectively, such that the voltage at said third node equals said high input reference voltage and the voltage at said fourth node equals said low input reference voltage.

6. The circuit of claim 5, wherein said feedback circuit comprises:

a first operational amplifier having said first bias voltage as an output and having said high input reference voltage and the voltage at said third node as inputs, said input voltages being connected such that the magnitude of the current through said second voltage controlled current source is inversely dependent on the voltage at said third node;

a second operational amplifier having said second bias voltage as an output and having said low input reference voltage and the voltage at said fourth node as inputs, said input voltages being connected such that the magnitude of the current through said second voltage controlled current sink is dependent on the voltage at said fourth node.

7. The circuit of claim 5, further including at least one of a first capacitor connected between the output of said first operational amplifier and said fourth node and a second capacitor connected between the output of said second operational amplifier and said third node.

8. The circuit of claim 5, wherein said first resistance of said terminating resistor equals said reference resistance and said second voltage controlled current source, second voltage controlled current sink, fifth switch, and sixth switch have substantially the same operating characteristics as said first voltage controlled current source, first voltage controlled current sink, first switch, and fourth switch, respectively.

9. The circuit of claim 2, wherein said second voltage reference circuit comprises:
   a second voltage controlled current source under the control of said first bias voltage and being connected to said first supply voltage;
   a fifth switch biased in the conducting state and connected in series between said second voltage controlled current source and a second voltage controlled resistor at a third node;
   a second voltage controlled current sink under the control of said second bias voltage and being connected to ground;
   a sixth switch biased in the conducting state and being connected in series between said second voltage controlled current sink and said second voltage controlled resistor at a fourth node; and
   a feedback circuit generating said third bias voltage which biases said second voltage controlled resistor such that the voltage at said third node equals said high input reference voltage and the voltage at said fourth node equals said low input reference voltage.

10. The circuit of claim 9, wherein said feedback circuit comprises an operational amplifier having said third bias voltage as an output and having as inputs said high input reference voltage and the voltage at said third node connected such that the resistance of said second voltage controlled resistor is inversely dependent on the voltage at said third node.

11. The circuit of claim 9, wherein said feedback circuit comprises an operational amplifier having as an output said third bias voltage and having as inputs said low input reference voltage and the voltage at said fourth node, said input voltages being connected such that the resistance of said second voltage controlled resistor is dependent on the voltage at said fourth node.

12. The circuit of claim 9, wherein said second voltage controlled current source, second voltage controlled current sink, second voltage controlled resistance, fifth switch, and sixth switch have substantially the same operating characteristics as said first voltage controlled current source, first voltage controlled current sink, first voltage controlled resistance, first switch, and fourth switch, respectively.

13. The circuit of claim 1, wherein said output buffer further includes a second voltage controlled resistance connected across said first and second balanced transmission lines.

14. The circuit of claim 13, wherein said second voltage controlled resistance has substantially the same operating characteristics as said first voltage controlled resistance.

15. The circuit of claim 1, wherein said input buffer further includes a hysteresis circuit between said first voltage controlled resistor and said comparator.

16. The circuit of claim 15, wherein said hysteresis circuit comprises a one-bit memory cell.

17. The circuit of claim 1, wherein said first voltage controlled resistor is connected across said first and second transmission lines.

18. The circuit of claim 17, further including a data enable circuit having a data enable signal as an input, said data enable circuit biasing said current switch in a non-conducting state to prevent current flow between said output buffer and said first and second transmission lines when said data enable signal is not active.

19. The circuit of claim 18 further including a resistance enable circuit having a resistance enable signal as an input, said resistance enable circuit biasing said first voltage controlled resistor in a high-impedance state when said resistance enable signal is not active.

20. The circuit of claim 3, wherein said first voltage controlled resistor is connected across said first and second transmission lines.

21. The circuit of claim 20, wherein said current switch control circuit further includes a data enable signal as an input, said current control circuit biasing said first through fourth switches as non-conducting when said data enable signal is not active.

22. The circuit of claim 21 further including a resistance enable circuit having a resistance enable signal as an input, said resistance enable circuit biasing said first voltage controlled resistor in a high-impedance state when said resistance enable signal is not active.

23. An integrated circuit that includes a differential swing interconnect I/O buffer comprising an output buffer and an input buffer;
   said input buffer having first and second inputs and comprising a first variable input resistor having resistance determined by a resistor control voltage and being connected between said first and second inputs and to an input detector circuit for detecting the polarity of a voltage drop across said variable input resistor;
   said output buffer having first and second outputs and comprising a first output buffer part connected between a power supply and said first and second outputs and a second output buffer part connected between ground and said first and second outputs;
   said first output buffer part comprising a first variable current source controlled by a source bias voltage and a first group of switches configurable as conducting or non-conducting, said first variable current source and said first group of switches being series-connected between said power supply and said first and second outputs;
   said second output buffer part comprising a first variable current sink controlled by a sink bias voltage and a second group of switches configurable as conducting or non-conducting, said first variable current sink and said second group of switches being series-connected between ground and said first and second outputs; and
   an output control circuit connected to said first and second groups of switches which controls the state of said switches to thereby define a first switch configuration wherein said first output is connected to said current source and said second output is connected to said current sink and a second switch configuration wherein said first output is connected to said current sink and said second output is connected to said current source; and
   wherein said first input is connected to said first output and said second input is connected to said second output.

24. An integrated circuit that includes a differential swing interconnect I/O buffer comprising an output buffer and an input buffer;

said input buffer having first and second inputs and comprising a first variable input resistor having resistance determined by a resistor control voltage and being connected between said first and second inputs and to an input detector circuit for detecting the polarity of a voltage drop across said variable input resistor;

said output buffer having first and second outputs and comprising a first output buffer part connected between a power supply and said first and second outputs and a second output buffer part connected between ground and said first and second outputs;

said first output buffer part comprising a first variable current source controlled by a source bias voltage and a first group of switches configurable as conducting or non-conducting, said first variable current source and said first group of switches being series-connected between said power supply and said first and second outputs;

said second output buffer part comprising a first variable current sink controlled by a sink bias voltage and a second group of switches configurable as conducting or non-conducting, said first variable current sink and said second group of switches being series-connected between ground and said first and second outputs; and an output control circuit connected to said first and second groups of switches which controls the state of said switches to thereby define a first switch configuration wherein said first output is connected to said current source and said second output is connected to said current sink and a second switch configuration wherein said first output is connected to said current sink and said second output is connected to said current source;

said integrated circuit being connected to a reference resistor and further including a current bias reference circuit which generates said source bias voltage and said sink bias voltage, said current bias reference circuit being connected to a high input reference voltage and a low input reference voltage and comprising:

a first current bias reference circuit part connected between said power supply and said reference resistor at a first reference node and comprising a second variable current source controlled by said source bias voltage;

a second current bias reference circuit part connected between ground and said reference resistor at a second reference node and comprising a second variable current sink controlled by said sink bias voltage; and a first feedback circuit that generates said source bias voltage with magnitude such that the voltage at said first reference node is substantially equal to said high input reference voltage and that generates said sink bias voltage with magnitude such that the voltage at said second reference node is substantially equal to said low input reference voltage, said first feedback circuit being connected so that the magnitude of the current through said second variable current source is inversely dependent on the voltage at said first reference node and the magnitude of the current through said second variable current sink is dependent on the voltage at said fourth node.

25. The circuit of claim 24 wherein said first current bias reference circuit part has substantially the same operating characteristics as said first output buffer part and said second current bias reference circuit part has substantially the same operating characteristics as said second output buffer part.

26. The circuit of claim 24, further including a resistor bias reference circuit for generating an active resistor biasing voltage and being connected to at least one of said high and low input reference voltages, wherein said resistor control voltage is equal to said active resistor biasing voltage and said resistor bias reference circuit comprises:

a first resistor bias reference circuit part connected between said power supply and a second variable input resistor at a third reference node, said second variable input resistor controlled by said active resistor biasing voltage, said first resistor bias reference circuit part comprising a third variable current source biased to said source bias voltage;

a second resistor bias reference circuit part connected between ground and said second variable input resistor at a fourth reference node, said second resistor bias reference circuit part comprising a third variable current sink controlled by said sink bias voltage; and a second feedback circuit that generates said active resistor biasing voltage with magnitude such that the voltage at said third reference node is substantially equal to said high input reference voltage and the voltage at said fourth reference node is substantially equal to said low input reference voltage.

27. The circuit of claim 26 wherein said second variable input resistor has substantially the same operating characteristics as said first variable input resistor in said input buffer, said first resistor bias reference circuit part has substantially the same operating characteristics as said first output buffer part, and said second resistor bias reference circuit part has substantially the same operating characteristics as said second output buffer part.

28. The circuit in claim 26 wherein said first input is connected to said first output at a first I/O node and said second input is connected to said second output at a second I/O node.

29. The circuit in claim 28 wherein each of said first, second, and third variable current source comprises a MOS transistor with a gate voltage equal to said source bias voltage.

30. The circuit in claim 28 wherein each of said first, second, and third variable current sink comprises a MOS transistor with a gate voltage equal to said sink bias voltage.

31. The circuit in claim 28 wherein said first group of switches comprises a first switch connected between said first variable current source and said first I/O node and a second switch connected between said first variable current source and said second I/O node, and said second group of switches comprises a third switch connected between said first I/O node and said first variable current sink and a fourth switch connected between said second I/O node and said first variable current sink.

32. The circuit in claim 31 wherein each of said first through fourth switches comprises a MOS transistor.

33. The circuit in claim 28 wherein said first variable input resistor comprises a MOS transistor with a gate voltage equal to said resistor control voltage.

34. The circuit in claim 33 wherein said first variable input resistor comprises a plurality of series-connected MOS transistors, each having a gate voltage equal to said resistor control voltage.

35. The circuit in claim 34 further including at least one capacitor connected between a pair of series connected MOS transistors and ground.

36. The circuit in claim 28 wherein said input detector circuit comprises a comparator.

37. The circuit in claim 28 wherein said first feedback circuit comprises a first operational amplifier having as inputs said high input reference voltage and the voltage at said first reference node and having as output said source bias voltage and a second operational amplifier having as inputs said low input reference voltage and the voltage at said second reference node and having as output said sink bias voltage.

38. The circuit in claim 37 further including at least one of a first capacitor connected between the output of said first operational amplifier and said second reference node and a second capacitor connected between the output of said second operational amplifier and said first reference node.

39. The circuit in claim 28 wherein said second feedback circuit comprises an operational amplifier having as inputs said high input reference voltage and the voltage at said third reference node and having as output said active resistor biasing voltage.

40. The circuit in claim 28 wherein said first input buffer part further comprises at least one gain-limiting resistor connected in series between said first variable current source and said first variable current sink.

41. The circuit in claim 28 further including a resistor enable circuit having a resistor enable signal, said resistor enable circuit alternatively selecting in response to said resistor enable signal a resistor control voltage as one of said active resistor biasing voltage to enable said variable input resistor and a biasing voltage with magnitude sufficient to disable said variable input resistor by placing it in a high-impedance state.

42. The circuit in claim 41 further including a third switch configuration selectable by said output control circuit wherein all switches which are connected to at least one of said first and second outputs, are in the non-conducting state.

43. The circuit of claim 42 wherein said first current bias reference circuit part and said first resistor bias reference circuit part each have substantially the same operating characteristics as said first output buffer part, said second current bias reference circuit part and said second resistor bias reference circuit part each have substantially the same operating characteristics as said second output buffer part, and said second variable input resistor has substantially the same operating characteristics as said first variable input resistor.

44. A plurality of circuits as in claim 42 connected to first and second balanced transmission lines each having a first and second end, wherein each of said circuits has said first output connected to said first transmission line and said second output connected to said second transmission line, said plurality of circuits including a first circuit connected to the transmission lines at said first ends and a second circuit connected to the transmission lines at said second ends.

45. The plurality of circuits in claim 44 wherein said first variable input resistor in said first and second circuits is enabled and said first variable input resistor in all other of said plurality of circuits is disabled.

46. A current biasing circuit that generates bias voltages for a plurality of current sources and generates a controlled voltage and current at two points, said current biasing circuit comprising:
   a first voltage controlled current source series connected between a supply voltage and a reference resistor at a first node;
   a first voltage controlled current sink series connected between ground and said reference resistor at a second node;
   a first feedback circuit having inputs connected to a first reference voltage and said first node and having an output connected to said first voltage controlled current source, whereby said first feedback circuit biases said first voltage controlled current source so that the voltage at said first node is substantially equal to said first reference voltage; and
   a second feedback circuit having inputs connected to a second reference voltage and said second node and having an output connected to said first voltage controlled current sink, whereby said second feedback circuit biases said first voltage controlled current sink so that the voltage at said second node is substantially equal to said second reference voltage.

47. An active resistor control circuit biased by the current biasing circuit of claim 46, said resistor control circuit comprising:
   a second voltage controlled current source series connected between said power supply and a voltage controlled resistor at a third node, said second current source sourcing a current determined by the output voltage of said first feedback circuit;
   a second voltage controlled current sink series connected between ground and said voltage controlled resistor at a fourth node, said second current sink sinking a current determined by the output voltage of said second feedback circuit; and
   a third feedback circuit having inputs connected to said second reference voltage and the voltage at said fourth node and having an output connected to said voltage controlled resistor, whereby said third feedback circuit biases said voltage controlled resistor so that the voltage at said fourth node is substantially equal to said second reference voltage.

48. The current biasing circuit of claim 46, further comprising at least one of a first capacitor connected between said second node and the output of said first feedback circuit and a second capacitor connected between said first node and the output of said second feedback circuit.

49. The current biasing circuit of claim 46, wherein said first and second feedback circuits comprise operational amplifiers.

50. An output buffer circuit biased by the current biasing circuit of claim 48, wherein said output buffer circuit comprises:
   an output current source connected between said power supply and a current switch and sourcing a current determined by the output voltage of said first feedback circuit; and
   an output current sink connected between said current switch and ground and sinking a current determined by the output voltage of said second feedback circuit;
   wherein a load may be connected to said output current source and output current sink through said current switch.

51. An active resistor control circuit biased by the current biasing circuit of claim 46, said resistor control circuit comprising:
   a second voltage controlled current source series connected between said power supply and a voltage controlled resistor at a third node, said second current source sourcing a current determined by the output voltage of said first feedback circuit;
   a second voltage controlled current sink series connected between ground and said voltage controlled resistor at a fourth node, said second current sink sinking a current determined by the output voltage of said second feedback circuit; and a third feedback circuit having inputs connected to said first reference voltage and the voltage at said third node and having an output connected to said voltage controlled resistor, whereby said third feedback circuit biases said voltage controlled resistor so that the voltage at said third node is substantially equal to said first reference voltage.

52. The resistor control circuit of claim 51, wherein said third feedback circuit comprises an operational amplifier.

53. An input buffer circuit biased by the resistor control circuit of claim 51, wherein said input buffer comprises a voltage controlled input resistor having a resistance determined by the output voltage of said third feedback circuit.

54. An input buffer circuit biased by the resistor control circuit of claim 47, wherein said input buffer comprises a voltage controlled input resistor having a resistance determined by the output voltage of said third feedback circuit.

55. The resistor control circuit of claim 47, wherein said third feedback circuit comprises an operational amplifier.

\* \* \* \* \*